United States Patent
Linke et al.

(10) Patent No.: US 11,746,409 B2
(45) Date of Patent: Sep. 5, 2023

(54) PROCESS FOR PRODUCING AND USING A W—NI SPUTTERING TARGET

(71) Applicant: PLANSEE SE, Reutte (AT)

(72) Inventors: Christian Linke, Ehenbichl (AT); Thomas Scherer, Lechaschau (AT)

(73) Assignee: Plansee SE, Reutte (AT)

( * ) Notice: Subject to any disclaimer, the term of this patent is extended or adjusted under 35 U.S.C. 154(b) by 29 days.

(21) Appl. No.: 17/235,003

(22) Filed: Apr. 20, 2021

(65) Prior Publication Data

US 2021/0246544 A1 Aug. 12, 2021

Related U.S. Application Data

(62) Division of application No. 15/106,393, filed as application No. PCT/AT2014/000225 on Dec. 17, 2014, now abandoned.

(30) Foreign Application Priority Data

Dec. 20, 2013 (AT) ..................................... 456/2013

(51) Int. Cl.
| | |
|---|---|
| C23C 14/34 | (2006.01) |
| B22F 3/10 | (2006.01) |
| C22C 1/04 | (2023.01) |
| G02F 1/1524 | (2019.01) |
| B22F 3/16 | (2006.01) |

(Continued)

(52) U.S. Cl.
CPC ........ *C23C 14/3414* (2013.01); *B22F 3/1028* (2013.01); *B22F 3/16* (2013.01); *B22F 3/17* (2013.01); *C22C 1/045* (2013.01); *C22C 1/0433* (2013.01); *C22C 19/03* (2013.01); *C22C 27/04* (2013.01); *C22F 1/10* (2013.01); *C22F 1/18* (2013.01); *C23C 14/14* (2013.01);

(Continued)

(58) Field of Classification Search
None
See application file for complete search history.

(56) References Cited

U.S. PATENT DOCUMENTS

| | | | | |
|---|---|---|---|---|
| 3,979,209 A | * | 9/1976 | Snyder, Jr. .............. | C22C 1/045 419/39 |
| 5,712,046 A | | 1/1998 | Kamidaira ............... | C25D 1/04 204/212 |

(Continued)

FOREIGN PATENT DOCUMENTS

| | | |
|---|---|---|
| CN | 1312301 C | 4/2007 |
| EP | 1696261 A1 | 8/2006 |

(Continued)

OTHER PUBLICATIONS

Lee, S.-H., et al., "Electrochromic behavior of Ni—W oxide electrodes", Solar Energy Materials and Solar Cells, Dec. 1995, 99. 155-166, vol. 39, Elsevier Science B.V.

*Primary Examiner* — Jason Berman
(74) *Attorney, Agent, or Firm* — Laurence A. Greenberg; Werner H. Stemer; Ralph E. Locher

(57) ABSTRACT

A process for producing a W—Ni sputtering target includes providing the sputtering target with 45 to 75 wt % W and a remainder of Ni and common impurities. The sputtering target contains a Ni(W) phase, a W phase and no or less than 10% by area on average of intermetallic phases measured at a target material cross section.

7 Claims, 3 Drawing Sheets

(51) Int. Cl.
    *B22F 3/17*      (2006.01)
    *C22C 19/03*     (2006.01)
    *C22C 27/04*     (2006.01)
    *C22F 1/10*      (2006.01)
    *C22F 1/18*      (2006.01)
    *C23C 14/14*     (2006.01)
    *H01J 37/34*     (2006.01)

(52) U.S. Cl.
    CPC ........ *G02F 1/1524* (2019.01); *H01J 37/3429* (2013.01); *B22F 2998/10* (2013.01)

(56) References Cited

U.S. PATENT DOCUMENTS

| | | | |
|---|---|---|---|
| 7,372,610 B2 | 5/2008 | Burdis et al. | |
| 7,604,717 B2 | 10/2009 | Beteille et al. | |
| 8,080,201 B2 | 12/2011 | Sawada et al. | |
| 9,051,645 B2 | 6/2015 | Senda et al. | |
| 2003/0121777 A1 | 7/2003 | Sato | C23C 4/00 204/298.12 |
| 2005/0247386 A1* | 11/2005 | Matera | C22C 19/07 148/668 |
| 2009/0022614 A1 | 1/2009 | Sawada et al. | |
| 2010/0140084 A1 | 6/2010 | Lo et al. | |
| 2010/0243427 A1* | 9/2010 | Kozlowski | G02F 1/1525 427/126.6 |
| 2010/0245973 A1 | 9/2010 | Wang et al. | |
| 2011/0155570 A1* | 6/2011 | Senda | H01L 21/76843 419/23 |
| 2013/0164511 A1 | 6/2013 | Bae et al. | |
| 2013/0194652 A1 | 8/2013 | Choi et al. | |
| 2017/0184937 A1 | 6/2017 | Wang et al. | |

FOREIGN PATENT DOCUMENTS

| | | | |
|---|---|---|---|
| JP | 05009541 A | | 1/1993 |
| JP | H059641 A | | 1/1993 |
| JP | H05508509 A | | 11/1993 |
| JP | H09512061 A | * | 12/1997 |
| JP | 2000169923 A | | 6/2000 |
| JP | 2006235632 A | | 9/2006 |
| JP | 2009155722 A | | 7/2009 |
| TW | 200924877 A | | 6/2009 |
| TW | 201928233 A | | 8/2010 |
| TW | 201103999 A | | 2/2011 |
| TW | 201126647 A | | 8/2011 |
| TW | 201211664 A | | 3/2012 |
| TW | 201222119 A | | 6/2012 |
| WO | 9201080 A1 | | 1/1992 |
| WO | 0071777 A1 | | 11/2000 |
| WO | 2010119785 A1 | | 10/2010 |

\* cited by examiner

PROCESS FOR PRODUCING AND USING A W—NI SPUTTERING TARGET

CROSS-REFERENCE TO RELATED APPLICATION

This application is a Divisional of U.S. application Ser. No. 15/106,393, filed Jun. 20, 2016; which was a § 371 National Stage filing of International Application PCT/AT2014/000225, filed Dec. 17, 2014, which designated the United States; this application also claims the priority, under 35 U.S.C. § 119, of Austrian Patent Application GM 456/2013, filed Dec. 20, 2013; the prior applications are herewith incorporated by reference in their entirety.

BACKGROUND OF THE INVENTION

Field of the Invention

The invention relates to a process for producing and using a W—Ni sputtering target for producing electrochromic layers via the powder-metallurgical route.

Electrochromic behavior can broadly be defined as a lasting and reversible change in the optical properties of a material which is induced by an applied electric field or an electric current. Advantages of a color change brought about in this way are, for example, very high possible contrasts combined with short switching times and also no restriction in respect of the viewing angle onto the electrochromic material. These advantages make electrochromic materials, in particular electrochromic layers, interesting for use in electrochromic displays and also, for example, for "smart glass".

Electrochromic layers or layer systems can be produced by the process of physical vapour deposition (PVD). This is a coating process in which layer formation takes place by bringing the layer-forming particles from a target into the gas phase and condensing them on the substrate to be coated. The objective of the process is to deposit homogeneous layers having a uniform layer thickness and also a homogeneous composition.

Layers which are known to display electrochromic behavior are, for example, the transition metal oxides $WO_3$, $MoO_3$, $V_2O_5$, $TiO_2$, $Nb_2O_5$ and $NiO_xH_y$. Tungsten oxide $WO_3$ is cathodically colored by incorporation of H+ or Li+ ions, while $NiO_x$ is cathodically decolorized by incorporation of Li+ ions. The combination of these two oxides as electrode layers is optimal for use in efficient electrochromic displays or glasses. A further improvement can be achieved by, for example, using W—Ni mixed oxide layers instead of pure $NiO_x$ layers since this enables the switching behavior and the stability of the electrochromic displays to be improved further.

Electrochromic layers composed of W—Ni mixed oxides have been known for many years and are described, for example, in "Lee, Electrochromic behavior of Ni—W oxide electrodes, Solar Energy Materials and Solar Cells 39 (1995) 155-166".

A particularly advantageous atomic ratio of W/Ni in the $NiO_x$ alloyed with W (W—Ni mixed oxide) is about 0.33.

At this ratio, the charge transfer resistance is optimal so as to ensure very fast optical switching behavior of the electrochromic layer.

Electrochromic layers produced in this way are made using, for example, sputtering targets composed of W—Ni alloys which are ablated by reactive magnetron sputtering under oxygen to form W—Ni mixed oxide layers. Oxidic targets are also known from the prior art. The production of electrochromic devices, for example electrochromic glasses, is described, for example, in EP 1 696 261 A1 or US 2010 0245973 A1.

The deposition of Ni oxide layers in order to produce an electrochromic material from a mainly metallic target is described in WO 2000 71777 A1. A reduction in or avoidance of ferromagnetism in the target is sought by means of small additions of a further element. This is effected, for example, by addition of W in an amount of about 7 at % to Ni due to lowering of the Curie temperature of the Ni mixed crystal. This relationship can also clearly be seen from the W—Ni phase diagram (see FIG. 1).

Sputtering targets composed of W—Ni alloys as used at present are preferably produced by thermal spraying. The use of Ni and W powders as starting material for making the targets has the consequence that pure nickel, which displays ferromagnetic properties, is sometimes present in the target material. These ferromagnetic regions are disadvantageous for magnetron sputtering since they result in different coating rates and thus have a disadvantageous influence on the homogeneity of the deposited layer.

In addition, only limited material densities can be produced in thermal spraying processes. Low densities of the sputtering target material likewise have an adverse effect on the coating rates. Furthermore, only limited material thicknesses can be produced by means of thermal spraying, which limits the materials utilization and useful life of the target.

The metallic impurities present in the spray powder as a result of the method of production, which are transferred directly into the target material produced, are a further disadvantage. Impurities in the sputtered layers can have an adverse effect on the optical layer properties.

Additional non-metallic, in particular oxidic or dielectric inclusions or phases which can be incorporated into the target material during thermal spraying, lead to an increased number of particles during sputtering which in turn can have a disadvantageous effect on the properties of the sputtered layer (adhesion, specific electrical resistance, layer homogeneity) and the coating process (high arcing rate).

Further possible ways of producing sputtering targets composed of W and Ni are indicated in JP 2000 169923 A, US 2009 022614 A1, JP 2009 155722 A and WO 2010 119785 A1. JP 2000 169923 A describes the melt-metallurgical production of W—Ni sputtering targets having low W contents below 20 at % (44% by weight) and US 2009 022614 A1 and JP 2009 155722 A describe the powder-metallurgical production of such targets. WO 2010 119785 A1 reports the production of W—Ni sputtering targets having very high W contents of more than 70 at % (88% by weight).

As described above, adequately high ratios of W/Ni, for example 0.33, are optimal for use in electrochromic layers. This ratio corresponds to a W content in Ni of about 50% by weight. As can be seen from the phase diagram (see FIG. 1), intermetallic phases occur at W contents of as low as about 30% by weight. In particular, occurrence of the brittle $Ni_4W$ phase is unavoidable; at even higher W contents, NiW or $NiW_2$, for example, can also be present.

The term intermetallic phases refers to phases which occur in binary, ternary or multicomponent systems and whose existence range does not continue to the pure components. They frequently have crystal structures which deviate from the crystal structures of the pure components and also proportions of non-metallic bonding types. Intermetallic phases are, in particular, characterized by a composition having a different valency and a finite homogeneity range, i.e. a narrow stoichiometric composition. Intermetallic phases are frequently brittle, i.e. possess low toughness which subsequently usually has an adverse effect on the target material.

BRIEF SUMMARY OF THE INVENTION

It is accordingly an object of the invention to provide process for producing and using a W—Ni sputtering target having a composition range which is optimal for the use described and also a property profile and microstructure which avoids the abovementioned disadvantages.

The production process of the invention should make it possible to produce a W—Ni sputtering target having a high purity and also a homogeneous and fine-grained microstructure. Furthermore, the production process should be inexpensive and reproducible.

The object is achieved by the independent claims. Advantageous embodiments are indicated in the dependent claims.

A sputtering target according to the invention contains from 45 to 75% by weight of W, a balance Ni and normal impurities. It is characterized in that it contains an Ni(W) phase, W phase and no or less than 10% by area on average of intermetallic phases measured at a cross section of the target material.

The Ni(W) phase is, as can also be seen from the phase diagram (FIG. 1), a pure Ni phase or Ni mixed crystal alloyed with W, preferably W-saturated Ni mixed crystal. Saturation with W occurs at about 35% by weight (15 at %) (see FIG. 1). In contrast, the W phase has only a very low solubility for Ni.

The intermetallic phases can be, for example, the intermetallic Ni4W phase, but the occurrence of other intermetallic phases (NiW, NiW2) in the system Ni—W and in particular in the composition range sought is also possible. A proportion of intermetallic phases of greater than 10% can lead, firstly, to nonuniform ablation over the target material and thus fluctuations in the thickness of the deposited layer occurring due to the different sputtering rate of the intermetallic phases compared to the remainder of the target. Furthermore, intermetallic brittle phases present in the microstructure of the target material can lead to arcing (local melting caused by an occurrence of an electric arc) or increased particle formation. The low toughness of the intermetallic phases also makes handling of the target more difficult.

A sputtering target according to the invention preferably contains less than 5% by area on average of intermetallic phases measured at a cross section of the target material.

The occurrence of intermetallic phases in a sputtering target according to the invention can very easily be confirmed or ruled out by means of X-ray diffraction (XRD) (taking into account the respective X-ray detection limit) using the relevant JCPDS cards.

To determine the proportion of intermetallic phases present in a sputtering target according to the invention, the average proportion by area is analysed at a cross section. For this purpose, a metallographic polished section is produced and examined by optical or electron microscopy. A metallographic polished section is a two-dimensional section of the three-dimensional target material. Areal analyses can be carried out by means of commercially available image analysis software on micrographs produced in this way. This is carried out by image analysis in order to determine proportions of individual phases in the abovementioned microstructure, typically by contrasting of the phases to be distinguished. Difficult-to-distinguish phases can be contrasted further by means of suitable etching processes. In the present case, the intermetallic Ni4W phase can be made distinguishable from the Ni mixed crystal (Ni(W) phase, W-saturated Ni mixed crystal) by etching with a suitable etching solution (e.g. 85 ml of ammonia solution and 5 ml of 30% solution hydrogen peroxide) and the proportion by area can be determined. However, depending on the state of the microstructure, alternative etching solutions and processes are conceivable. The average proportion by area is calculated as arithmetic mean of 5 measurements of the proportion by area measured on 5 image regions having a size of 100×100 µm of a metallographic polished section, recorded with 1000× magnification.

However, the occurrence of intermetallic phases is not disadvantageous in respect of the magnetic properties of a sputtering target according to the invention since the Ni-containing intermetallic phases occurring in the W—Ni system are not ferromagnetic.

As can be seen from the phase diagram in FIG. 1, the brittle Ni4W phase occurs preferentially at a W content of less than 45% by weight in a sputtering target. At even lower proportions of W, ferromagnetic Ni phase can occur. At W contents of greater than 75% by weight, the hardness of the target material is too high in order to be able to ensure optimal and economical processability. Furthermore, the occurrence of the intermetallic phases NiW and NiW2 is greatly favored at these contents. In addition, at W contents of less than 45% by weight and greater than 75% by weight, the W/Ni ratio required for optimal functioning of an electrochromic layer deposited by means of a sputtering target can no longer be optimally achieved.

The term "usual impurities" refers to production-related contamination with gases or accompanying elements which originate from the raw materials used. The proportion of such impurities in a sputtering target according to the invention is preferably in the range below 100 µg/g (corresponding to ppm) for gases (C, H, N, O) and below 500 µg/g for other elements. Suitable methods of chemical elementary analysis are known to be dependent on the chemical element to be analysed. Chemical analysis of a conductive target material according to the invention was carried out using ICP-OES (optical emission spectroscopy with inductively coupled plasma), XRF (X-ray fluorescence analysis) and GDMS (glow discharge mass spectrometry).

A sputtering target according to the invention preferably has an oxygen content of less than 100 µg/g, particularly preferably less than 90 µg/g, more preferably less than 75 µg/g, even more preferably less than 50 µg/g.

The oxygen content can be determined in a simple way by ICP-OES.

A sputtering target according to the invention is characterized by a hardness which is preferably below 500 HV10.

It has been found that satisfactory toughness of the target material can optimally be ensured at hardnesses of less than 500 HV10. This simplifies handling during the production process, for example during an optional mechanical shaping step.

During use, especially as single-piece tubular target in one embodiment, a hardness of less than 500 HV10 significantly simplifies handling.

The hardness in HV10 (Vickers hardness) is for the present purposes an arithmetic mean determined from 5 hardness measurements.

A sputtering target according to the invention preferably has a relative density of more than 96%. A relative density of more than 99% is particularly advantageous. The higher the density of the target, the more advantageous are its properties. Targets having a low relative density have a relatively high proportion of pores which can be a virtual leak and/or a source of impurities and particles during the sputtering process. In addition, targets having a low density tend to absorb water or other impurities, which can lead to difficult-to-control process parameters. In addition, the ablation rate of material which is densified to only a low extent is lower during the sputtering process than that of material having a higher relative density.

The relative density can, as is known, easily be determined by means of buoyancy methods using the Archimedes principle.

The installation of a sputtering target according to the invention in various coating plants and also for the coating of substrates having different geometries places various geometric demands on a sputtering target according to the invention. Thus, a target of this type can be in the form of a flat target, for example as plate or disc, as rod, as tubular target or as body having another complex shape.

A sputtering target according to the invention is preferably a tubular sputtering target.

An embodiment as tubular target gives increased possible utilization compared to flat targets. The embodiment as tubular target gives further particular advantages in respect of the properties of the sputtering target. Due to the particularly advantageous surface area to volume ratio, in particular at low wall thicknesses, a particularly good outgassing behavior during the production process is obtained. Thus, particularly low contents of gaseous impurities, in particular oxygen, can be realized.

A sputtering target according to the invention is also preferably a one-piece tubular target.

The preferred design as one-piece tubular target enables particularly homogeneous layers to be deposited on large-area substrates since no discontinuities (for example joins, undercuts, residues of solder material, impurities in the region of a join) between individual pieces (segments) of a target are present.

The design as one-piece tubular target makes it possible to avoid shifting of individual pieces of the target due to different temperatures or temperature cycles during the coating process, in contrast to multipart tubular targets. In addition, the homogeneity of the target material in respect of the chemical purity or the microstructure is better in the case of one-piece tubular targets than in the case of multi-part tubular targets.

However, a sputtering target according to the invention can be configured not only as one-piece tubular target. Thus, it can both be present as one-piece or multipart tubular target or have various regions having different external diameters or relative densities over its length ("dog bone" target). Such an embodiment enables, for example, nonuniform ablation of the sputtering target at the ends of the target material ("cross-corner effect") to be reduced or be largely avoided. A target having regions of different diameters can also be constructed in both one piece and as a multipart target.

Furthermore, a sputtering target according to the invention can have a corrosion resistant protective facility, for example in the form of paint or varnish or in the form of a polymer coating, at least on parts of the internal diameter.

A sputtering target according to the invention preferably has a proportion by area of W phase measured on a cross section of the target material in the range from 15% to 45%.

A proportion by area of W phase of less than 15% can be associated with an increased proportion of brittle Ni4W phase or ferromagnetic Ni phase and accordingly lead to poor sputtering behavior and, in the first case, also to reduced toughness of the target material. Proportions by area of W phase of greater than 45% can have an adverse effect on the hardness of the target material and the processability.

The proportion of W phase is, like the proportion by area of the intermetallic phases, determined by suitable evaluation of a metallographic polished section as described above.

A sputtering target according to the invention preferably has an average grain size of the W phase of less than 40 µm, more preferably less than 20 µm.

An average grain size of the W phase of less than 40 µm, more preferably less than 20 µm, leads to a particularly uniform sputtering behavior and thus to deposition of particularly homogeneous layers having a particularly uniform thickness. In addition, the notch effect of the W phase is kept low in this way and satisfactory toughness of the target material is optimally ensured as a result.

Agglomerates of a plurality of grains of the W phase can exceed dimensions of 40 µm in diameter, but such agglomerates are not considered to be individual grains of the W phase in a sputtering target according to the invention.

The average grain size of the W phase can be determined in a simple way by a line section method, for example as indicated in ASTM E112-12, on a metallographic polished section.

A sputtering target according to the invention preferably has a texture of <110> parallel to the main deformation direction in the Ni(W) phase.

A sputtering target according to the invention preferably has a texture of <100> parallel to the main deformation direction or <111> parallel to the main deformation direction or proportions of both texture components mentioned parallel to the main deformation direction in the W phase.

In the preferred case of a tubular sputtering target, in particular a one-piece tubular target, the radical direction is the main deformation direction. In the case of a plate-shaped target, the normal to the plane is the main deformation direction.

The texture of a crystalline material can, as is known, be measured by analysis using commercially available EBSD (electron backscatter diffraction) software in a scanning electron microscope. In the present case of a plurality of different possible phases having different crystallography, the texture of each individual phase (e.g. W phase, Ni(W) phase) can be determined. The texture of the Ni(W) phase has been found to be most suitable for characterization of a sputtering target according to the invention, since this can be set particularly uniformly and stably during the course of an optional thermomechanical treatment as part of a production process according to the invention. In addition, deformation during the course of an optional thermomechanical treatment preferably takes place in this phase, as a result of which the desired texture can be obtained particularly reproducibly.

A W—Ni sputtering target according to the invention is preferably used for deposition of an electrochromic layer. Sputtering of a plurality of different sputtering targets (cosputtering) can be dispensed with in this way. In addition, coating of large-area substrates such as plate glass is made much easier by the preferred embodiment as tubular sputtering target, more preferably as one-piece tubular target.

Other possible preferred uses of W—Ni sputtering targets according to the invention are deposition of solar absorber layers, protective layers to guard against high-temperature oxidation or diffusion barrier layers.

A process according to the invention for producing a W—Ni sputtering target via the powder-metallurgical route is characterized in that it comprises at least the following steps:

a compacting step in which a powder mixture of W powder and Ni powder is compacted by application of pressure, heat or pressure and heat to give a blank;

a cooling step in which the resulting blank is cooled at a cooling rate of greater than 30 K/min at least in a temperature range from 900 to 750° C.

A compacting step as part of a process according to the invention for producing a W—Ni sputtering target leads to an appropriate powder mixture being compacted and densified by application of pressure, heat or pressure and heat to form a blank. This can occur by means of various process steps, for example by pressing and sintering, hot pressing, cold isostatic pressing, hot isostatic pressing or spark plasma sintering (SPS) or a combination of these or further methods of compacting powder mixtures.

The production of a powder mixture which can be used for a process according to the invention is preferably effected by weighing the appropriate amounts of W powder and Ni powder into a suitable mixing apparatus and mixing until homogeneous distribution of the components in the powder mixture is ensured. For the purposes of the present invention, the expression powder mixture includes prealloyed or partially alloyed powders containing the components W and Ni.

A powder mixture produced in this way is preferably introduced into a mould in order to implement the compacting step. Suitable moulds here are the die or flexible tube in cold isostatic pressing, the die of a hot press or a spark plasma sintering plant and also the can in the case of hot isostatic pressing.

A cooling step in which the blank obtained is cooled at a cooling rate of greater than 30 K/min at least in a temperature range from 900 to 750° C. as part of a process according to the invention for producing a W—Ni sputtering target leads to the occurrence, in particular the formation, of undesirable intermetallic phases such as Ni4W being largely avoided. An excessively high proportion of intermetallic phases in a W—Ni sputtering target produced by means of a process according to the invention can, firstly, lead to a sputtering rate different from that of the remaining target and thus to nonuniform ablation over the target material and consequently to fluctuations in the thickness of the deposited layer. Furthermore, brittle intermetallic phases in the microstructure of the target material can lead to arcing or increased particle formation. Secondly, handling of such a sputtering target is made more difficult by the low toughness of intermetallic phases.

A cooling step of this type can, for example, be realized by cooling in air, water or oil. Such a cooling step ensures that the formation of intermetallic phases is optimally avoided and that the sputtering target produced by the process has the best possible combination of microstructural and mechanical properties.

Preference is also given to the blank obtained being cooled at a cooling rate of greater than 50 K/min at least in the temperature range from 900 to 750° C., in such a cooling step since the materials properties described and the microstructure of the target can be set in a particularly optimized manner.

Preference is also given to the blank obtained being cooled at a cooling rate of greater than 30 K/min, most preferably greater than 50 K/min, at least in the temperature range from 1000 to 600° C., in such a cooling step since the materials properties described and the microstructure of the target can be set in a further optimized manner.

It has been found to be particularly advantageous for the compacting step to be effected by sintering at temperatures of from 1100 to 1450° C. in a process according to the invention for producing a W—Ni sputtering target. Here, sintering is a sintering process referred to as pressureless sintering at pressures of less than 2 MPa, preferably at pressures below atmospheric pressure.

Compaction at these temperatures optimally ensures that solid-phase sintering to very high relative densities takes place in the powder mixture present. At compaction at below 1100° C., the achievable density can be too low, while at temperatures above 1450° C. reductions in the mechanical stability of the target material can occur. In the case of compaction in the temperature range indicated, an optimal combination of high achieved density and optimal mechanical properties is ensured.

In a process according to the invention for producing a W—Ni sputtering target, a thermomechanical or thermal treatment of the blank obtained preferably takes place between the compacting step and the cooling step. Such a thermomechanical or thermal treatment can produce advantageous properties such as a further increase in the density and/or further homogenization of the microstructure.

Any small proportions of intermetallic phases still present can preferably be distributed homogeneously in the microstructure of the target material and adverse effects of these phases can thus be minimized by means of such a thermomechanical or thermal treatment. This fine distribution ensures uniform ablation without relief formation during sputtering.

In the process for producing a W/Ni sputtering target, it has been found to be particularly advantageous for a thermomechanical or thermal treatment employed to take place at temperatures in the range from 970 to 1450° C.

A thermomechanical or thermal treatment in the temperature range indicated takes place in the two-phase region W(Ni)+Ni(W) and in the preferred case leads to no or essentially no formation of further undesirable brittle intermetallic phases occurring. In the optimal case, intermetallic phases which can be present after compaction can largely be dissolved by such a thermomechanical or thermal treatment.

As a result of such substantial avoidance of undesirable brittle intermetallic phases, a W—Ni sputtering target produced by means of a process according to the invention can be shaped particularly well by forming. This in turn simplifies the production of large-format sputtering targets and in particular long and preferably one-piece tubular targets and also has an advantageous effect on the nearness to the final geometry which can be achieved.

Suitable processes for carrying out a thermomechanical or thermal treatment for the purposes of the present invention are, for example, rolling, extrusion, forging, flow forming and hot isostatic pressing (HIP).

A thermomechanical or thermal treatment for the purposes of the present invention can be carried out as a single-stage or multistage process. A combination of a plurality of suitable processes is also possible. Thus, a thermomechanical or thermal treatment can contain one or more substeps which comprise no or essentially no deformation of the target material.

Both in a single-stage or in a multistage thermomechanical or thermal treatment, the blank obtained by compaction is preferably subjected to degrees of deformation (reduction in cross section) of from 20 to 80%. The degrees of deformation indicated can be effected in a single step or else in a plurality of steps.

At degrees of deformation in the range from 20% to 80%, the required density of the target material can be achieved particularly optimally; in addition, degrees of deformation of from 20 to 80% are particularly advantageous from an economic point of view.

It has been found to be particularly advantageous for a thermomechanical or thermal treatment in a process according to the invention for producing a W—Ni sputtering target to contain at least one forging step.

Defined degrees of deformation can be introduced into the target material in a particularly targeted way by a thermomechanical or thermal treatment containing at least one forging step. In this way, excessive strengthening, for example, and consequently exceeding of the deformation forces which can be applied can be avoided thereby.

Textures can be introduced into the target material in a targeted way by means of a thermomechanical or thermal treatment containing at least one forging step and these can in turn exert a positive influence both on the mechanical properties and on the sputtering properties of the target material.

Furthermore, one or more forging step(s) make(s) it possible to vary the thickness of the formed material over its length and set this thickness in a targeted manner, which can be utilized, in particular, for increasing the sputtering yield (regions having different external diameters over the length, "dog bone" target).

In addition, a uniform surface quality which is favourable for further mechanical processing or a further thermomechanical or thermal treatment of the target material, high straightness and good roundness can be achieved by means of forging.

A process for producing a sputtering target according to the invention can further comprise the following steps:
mechanical treatment
application to one or more support elements A mechanical treatment of the blank or target material obtained can be desirable or necessary after the compacting step, after the cooling step or after an optional thermomechanical or thermal treatment. Such a mechanical treatment, for example by cutting machining, grinding or polishing, enables both the final geometry to be set or made more precise and, for example, a particular desirable surface quality to be set.

A sputtering target produced by a process according to the invention can also be applied to one or more suitable support elements. This can, for example, be effected by means of a bonding step. Such support elements can, for example, be backing plates of various geometries or in the preferred case of a tubular sputtering target, in particular a one-piece tubular target, can be a support tube or else support elements which do not run through the entire tube, e.g. ports, flanges or other connecting parts or multipart support tubes or elements.

Such support elements can, for example, be made of stainless steel, Cu, Cu alloys, Ti or Ti alloys. However, other materials can also be used for producing such support elements.

For a bonding step, preference is given to using elements or alloys having a low melting point, for example indium. In addition, a bonding agent, for example Ni, can optionally be used in order to ensure better wetting. Instead of a bonding step, the application to suitable support elements can also be carried out by means of soldering or adhesive bonding or by mechanical locking, for example by screwing on or clamping.

The application of a corrosion-resistant protective facility, for example in the form of paint or varnish or in the form of a polymer coating, to at least parts of the internal diameter of the target material is also possible as further step in a process according to the invention for producing a W—Ni sputtering target.

In a preferred case, a sputtering target containing from 45 to 75% by weight of W, balance Ni and normal impurities is produced by means of a process according to the invention for producing a W—Ni sputtering target. In this case, use of the process of the invention ensures that a resulting W—Ni sputtering target contains Ni(W) phase, W phase and no or less than 10% by area on average of intermetallic phases measured at a cross section of the target material. Here, the proportion by area is the average proportion by area calculated as arithmetic mean of 5 measurements of the proportion by area measured on 5 image parts having a size of 100×100 μm of a metallographic polished section, recorded at 1000× enlargement.

A process according to the invention for producing a W—Ni sputtering target makes it possible to ensure relative densities of more than 96% in a W—Ni sputtering target produced by this process. In particularly preferred embodiments of the invention, relative densities of more than 99% can be achieved.

The purity and the mechanical properties of the resulting target material are also optimized by a process according to the invention for producing a W—Ni sputtering target.

Thus, a process according to the invention leads to very low contents of impurities in sputtering targets produced thereby, for example a preferred oxygen content of less than 100 μg/g, particularly preferably less than 90 μg/g, more preferably less than 75 μg/g, even more preferably less than 50 μg/g.

The substantial avoidance of formation of brittle intermetallic phases also preferably leads to an optimized hardness of a W—Ni sputtering target produced by means of a process according to the invention.

In a preferred case, a sputtering target containing from 45 to 75% by weight of W, balance Ni and normal impurities is produced by means of a process according to the invention for producing a W—Ni sputtering target. In this case, hardnesses of less than 500 HV10 are preferably achieved by means of a process according to the invention.

In a preferred case, a sputtering target containing from 45 to 75% by weight of W, balance Ni and normal impurities is produced by means of a process according to the invention for producing a W—Ni sputtering target. In this case, a proportion by area of W phase measured at a cross section of the target material in the range from 15% to 45% is achieved by means of a process according to the invention.

In a preferred case, a sputtering target containing from 45 to 75% by weight of W, balance Ni and normal impurities is produced by means of a process according to the invention for producing a W—Ni sputtering target. In this case, an average grain size of the W phase of less than 40 μm, more preferably less than 20 μm, is achieved by means of a process according to the invention.

When a process according to the invention for producing a W—Ni sputtering target in which, in the preferred case, a thermomechanical treatment takes place is employed, a W—Ni sputtering target produced thereby has a texture of <110> parallel to the main deformation direction in the Ni(W) phase.

When a process according to the invention for producing a W—Ni sputtering target in which, in the preferred case, a thermomechanical treatment takes place is employed, a W—Ni sputtering target produced thereby has a texture of <100> parallel to the main deformation direction or <111> parallel to the main deformation direction or proportions of both texture components mentioned parallel to the main deformation direction in the W phase.

In the preferred case of a tubular sputtering target, in particular a one-piece tubular target, the radial direction is the main deformation direction. In the case of a plate-shaped target, the normal to the plane is the main deformation direction.

Other features which are considered as characteristic for the invention are set forth in the appended claims.

Although the invention is illustrated and described herein as embodied in a process for producing and using a W—Ni sputtering target, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE EXAMPLES

The examples are summarized in Table 1.

The green body produced in this way was sintered at a temperature of 1350° C. in an indirect sintering furnace. The relative density after sintering was 95%.

After sintering, the tube was mechanically worked on all sides to give a geometry of 200 mm external diameter, 127 mm internal diameter and 900 mm length.

The tube was subsequently heated and forged on a mandrel at a temperature of 1300° C., giving a tube having a length of 1200 mm, an external diameter of 180 mm and an internal diameter of 120 mm which was cooled in air. A cooling rate of 37 K/min was achieved in the temperature range from 900 to 750° C.

The density after forging was 99.7%, and the hardness of the target material was 344 HV10. An oxygen content of 9 µg/g was measured.

In a measurement of the texture, a preferential orientation in the <110> direction in the Ni(W) phase was found. The area of the W phase was 30% and its average grain size was 15 µm. The proportions by area of intermetallic phase were 7%.

Example 2

A tube was produced by a method analogous to Example 1.

TABLE 1

| Example | W [wt %] | Ni [wt %] | Sintering temperature [° C.] | Thermomech. or therm. treatment, cooling | Degree of deformation [%] | Density [%] | Area of W phase [%] | Grain size of W phase [µm] | Area of intermet. phase [%] | Texture of Ni(W) | Hardness [HV10] | O content [µg/g] |
|---|---|---|---|---|---|---|---|---|---|---|---|---|
| 1* | 60 | 40 | 1350 | Forging, 1300° C., cooling in air | 25 | 99.7 | 30 | 15 | 7 | <110> | 344 | 9 |
| 2* | 60 | 40 | 1350 | Forging, 1250° C., heat treatment at 1000° C. for 1 h, cooling in air | 25 | 99.7 | 29 | 14 | <5 | <110> | 331 | 11 |
| 3* | 70 | 30 | 1350 | Forging, 1300° C., cooling in air | 50 | 99.5 | 39 | 19 | 8 | <110> | 442 | 70 |
| 4 | 43 | 57 | 1350 | None, furnace cooling | 0 | 78 | 8 | 18 | 12 | none | 163 | 268 |
| 5 | 60 | 40 | 1200 | None, furnace cooling | 0 | 77 | 30 | 15 | 15 | none | 165 | 96 |
| 6 | 60 | 40 | 1000 | Forging, 1300° C. (terminated), furnace cooling | 25 | 65 | — | — | — | — | 74 | 120 |

*marks examples according to the invention

Example 1

W metal powders having a particle size determined by the Fisher method of 4 µm and Ni metal powders having a particle size measured by the Fisher method of 4.2 µm were used as raw materials. The powders were introduced in a ratio of 60% by weight of W and 40% by weight of Ni into a closed vessel and mixed for 1 hour in a shaker.

A steel mandrel having a diameter of 141 mm was positioned in the middle of a rubber tub which had a diameter of 300 mm and was closed at one end. The powder mixture was introduced into the intermediate space between steel core and rubber wall and the rubber tube was closed at its open end by means of a rubber cap. The closed rubber tube was positioned in a cold isostatic press and pressed at a pressure of 200 MPa to give a green body in the form of a tube having a relative density of 61% and an external diameter of 240 mm.

The tube was subsequently forged on a mandrel at a temperature of 1250° C., giving a tube having a length of 1200 mm, an external diameter of 180 mm and an internal diameter of 120 mm. A heat treatment at 1000° C. for one hour was subsequently carried out, followed by cooling in air. A cooling rate of 58 K/min was achieved in the temperature range from 900 to 750° C.

The density was then 99.7% and the hardness of the target material was 331 HV10. An oxygen content of 11 µg/g was measured.

In a measurement of the texture, a preferential orientation in the <110> direction was found in the Ni(W) phase. The area of the W phase was 29% and its average grain size was 14 µm. The proportions by area of intermetallic phase were <5%, i.e. no proportions of intermetallic phase could be measured by means of XRD.

Example 3

A tube was produced by a method analogous to Examples 1 and 2, but W and Ni powders were used in a ratio of 70% by weight of W and 30% by weight of Ni.

The tube was subsequently forged on a mandrel at a temperature of 1300° C., giving a tube having a length of 1200 mm, an external diameter of 180 mm and an internal diameter of 120 mm, and this was cooled in air. A cooling rate of 34 K/min was achieved in the temperature range from 900 to 750° C.

The density was then 99.5% and the hardness of the target material was 442 HV10. An oxygen content of 70 µg/g was measured.

In a measurement of the texture, a preferential orientation in the <110> direction in the Ni(W) phase was found. The area of the W phase was 39% and its average size was 19 µm. The proportions by area of intermetallic phase were 8%.

Example 4

A tube was produced by a method analogous to Examples 1 to 3, but W and Ni powders were used in a ratio of 43% by weight of W and 57% by weight of Ni. No thermomechanical or thermal treatment was carried out. After sintering, the product was cooled in the furnace, with a cooling rate of about 10 K/min being achieved in the temperature range from 900 to 750° C. The density after sintering was 78% and the hardness of the target material was 163 HV10. The low hardness value is due to the low density. An oxygen content of 268 µg/g was measured.

The area of the W phase was 8% and its average grain size was 18 µm. The proportions by area of intermetallic phase were 12%.

Example 5

A tube was produced by a method analogous to Examples 1 and 2, but sintering was carried out at a temperature of 1200° C. No thermomechanical or thermal treatment was carried out. After sintering, the product was cooled in the furnace, with a cooling rate of about 10 K/min being achieved in the temperature range from 900 to 750° C. The density after sintering was 77% and the hardness of the target material was 165 HV10. The low hardness value is due to the low density. An oxygen content of 96 µg/g was measured.

The area of the W phase was 30% and its average size was 15 µm. The proportions by area of intermetallic phase were 15%.

Example 6

A tube was produced by a method analogous to Examples 1 and 2, but sintering was carried out at a temperature of 1000° C. After sintering, the product was cooled in the furnace, with a cooling rate of about 10 K/min being achieved in the temperature range from 900 to 750° C. The density after sintering was 77% and the hardness of the target material was 74 HV10. An oxygen content of 120 µg/g was measured. An attempt was subsequently made to forge the tube on a mandrel at 1300° C., but the experiment was stopped since the target material failed mechanically. No values for texture and proportions of phases and grain sizes could be determined.

Figure 1:
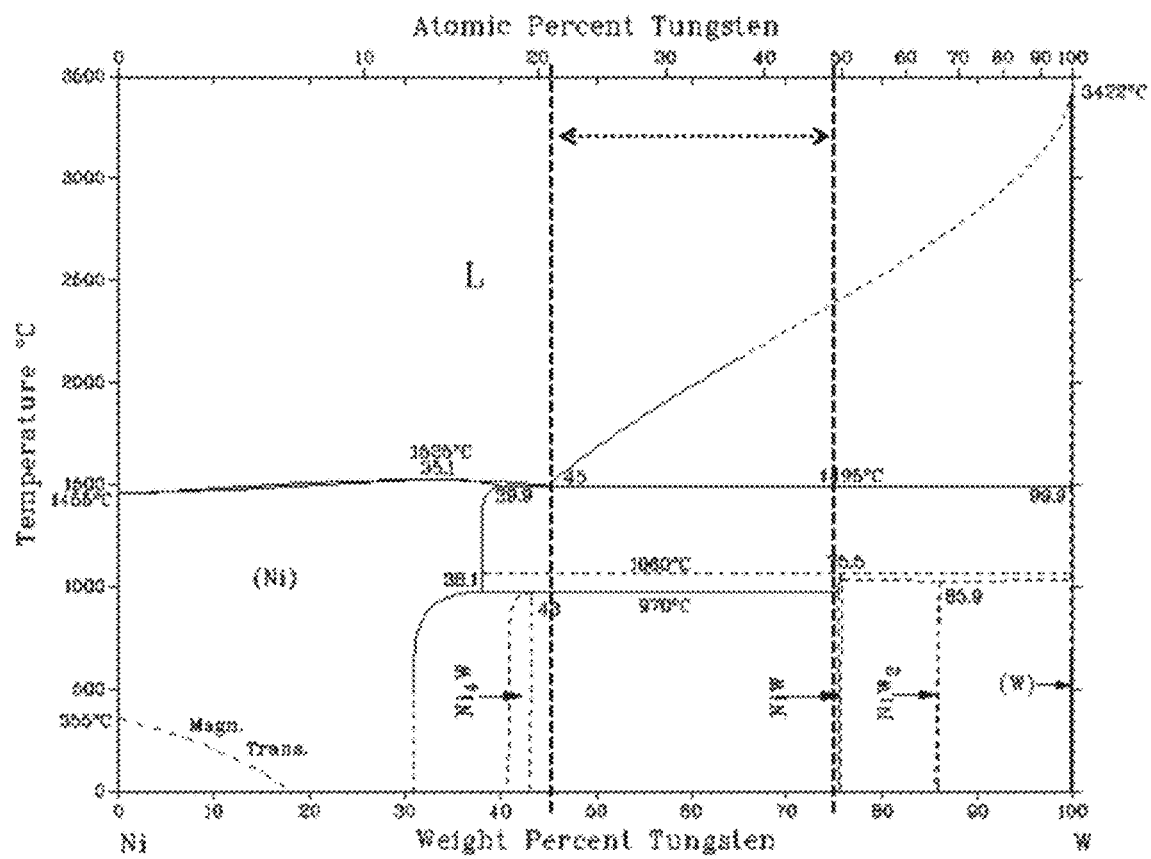
FIG. 1: Phase diagram of the Ni—W system (source: ASM International's Binary Alloy Phase Diagrams, Second Edition), composition range according to the invention marked.
Figure 2:
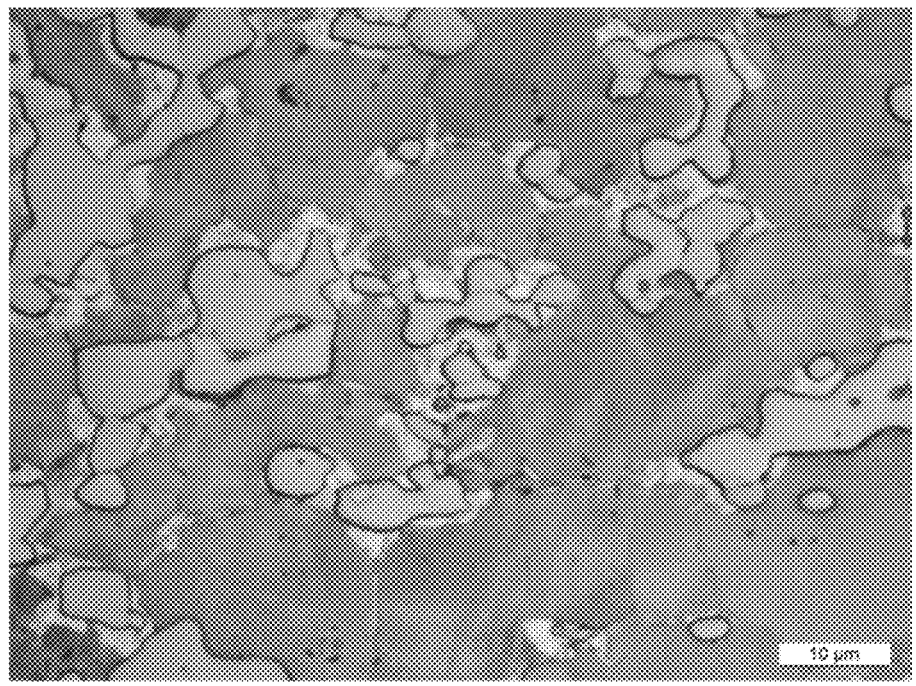
FIG. 2: Microstructure of a W—Ni sputtering target which is not according to the invention and contains 60% by weight of W, 40% by weight of Ni, etched using a solution composed of 85 ml of 25% strength $NH_4OH$+5 ml of $H_2O_2$. Proportion by area of intermetallic phase 11.7%, proportion by area of W phase 29.2%, balance Ni(W).
Figure 3:
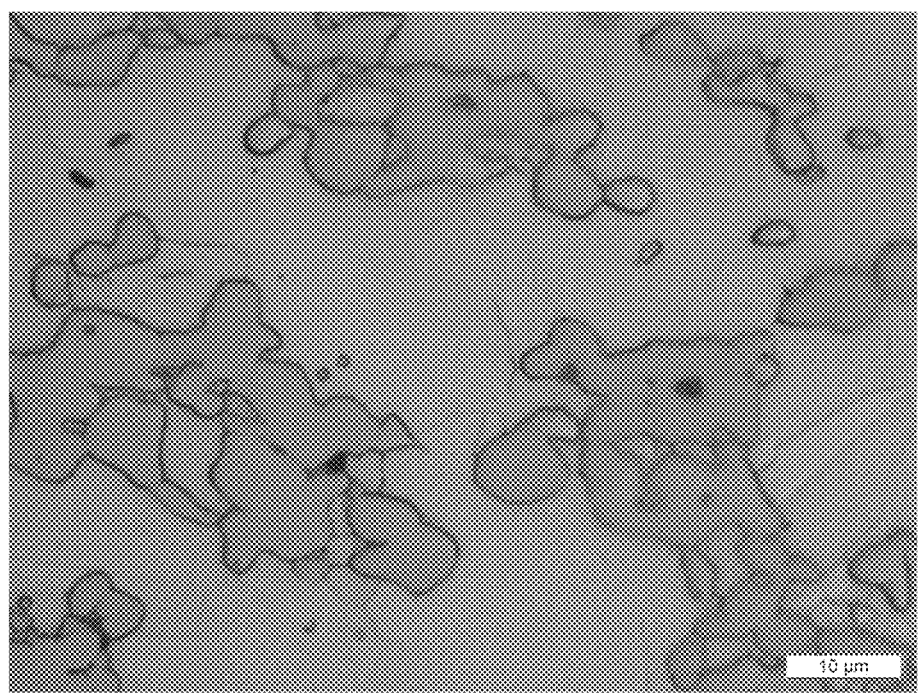
FIG. 3: Microstructure of a W—Ni sputtering target according to the invention containing 60% by weight of W, 40% by weight of Ni, etched using a solution composed of 85 ml of 25% strength $NH_4OH$+5 ml of $H_2O_2$. No measurable proportion by area of intermetallic phase, proportion by area of W phase 29.5%, balance Ni(W).
Figure 4:
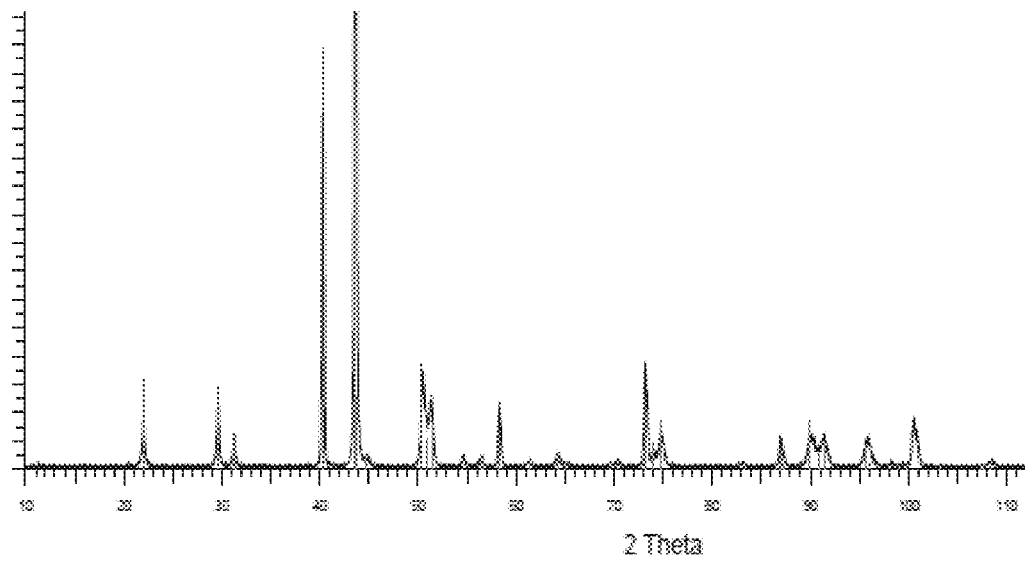
FIG. 4: X-ray diffraction pattern of a sample of a W—Ni sputtering target which is not according to the invention, proportions of intermetallic phase ($Ni_4W$) greater than 10% (area).
Figure 5:
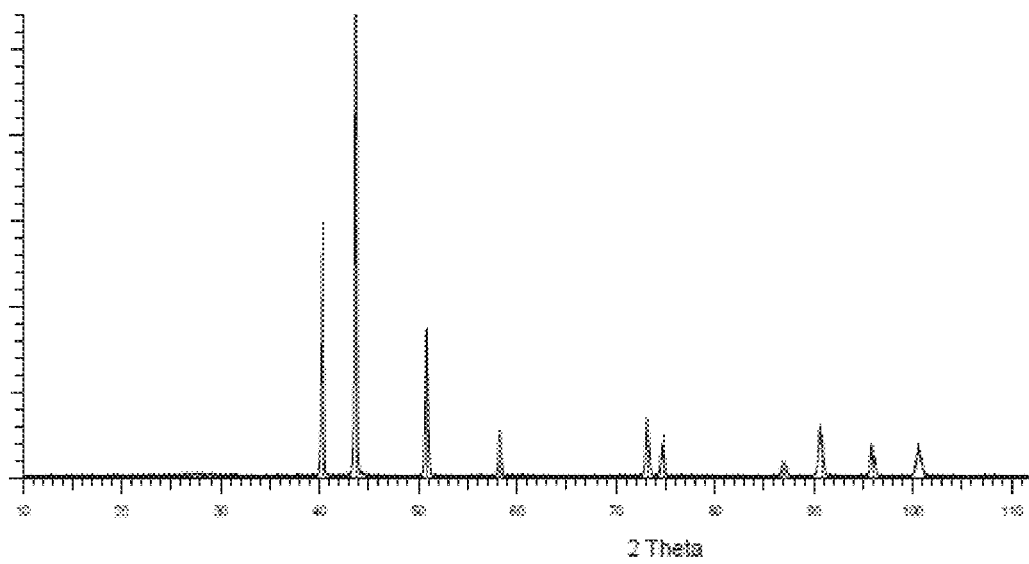
FIG. 5: X-ray diffraction pattern of a sample of a W—Ni sputtering target according to the invention, no proportions of intermetallic phase ($Ni_4W$) detectable.

For the evaluation of the diffraction patterns shown, the JCPDS cards 03-065-2673 ($Ni_4W$), 00-004-0806 (W) and 03-065-4828 ($Ni_{17}W_3$, corresponding to Ni(W), W-saturated Ni mixed crystal) were used.

The invention claimed is:

1. A process of using a sputtering target, the process comprising the following steps:
   using a sputtering target having from 45 to 75% by weight of W, a balance of Ni and normal impurities, a Ni(W) phase, a W phase and no or less than 10% by area on average of intermetallic phases measured at a target material cross section, for deposition of an electrochromic layer; and
   producing the sputtering target by at least compacting a powder mixture of W powder and Ni powder by application of pressure, heat or pressure and heat to provide a resulting blank, and cooling the resulting blank at a cooling rate of greater than 30 K/min at least in a temperature range of from 900 to 750° C.

2. A process of using of a sputtering target, the process comprising the following steps:
   using a sputtering target having from 45 to 75% by weight of W, a balance of Ni and normal impurities, a Ni(W) phase, a W phase and no or less than 10% by area on average of intermetallic phases measured at a target material cross section, for deposition of solar absorber layers, protective layers against high-temperature oxidation or diffusion barrier layers; and
   producing the sputtering target by at least compacting a powder mixture of W powder and Ni powder by application of pressure, heat or pressure and heat to provide a resulting blank, and cooling the resulting blank at a cooling rate of greater than 30 K/min at least in a temperature range of from 900 to 750° C.

3. A process for producing a W—Ni sputtering target using a powder-metallurgical route, the method comprising the following steps:
   carrying out a compacting step in which a powder mixture of W powder and Ni powder is compacted by application of pressure, heat or pressure and heat to give a resulting blank; and carrying out a cooling step in which the resulting blank is cooled at a cooling rate of greater than 30 K/min at least in a temperature range of from 900 to 750° C.

4. The process for producing a W—Ni sputtering target according to claim 3, which further comprises effecting the compacting step by sintering at temperatures of from 1100 to 1450° C.

5. The process for producing a W—Ni sputtering target according to claim 3, which further comprises performing a thermomechanical or thermal treatment of the blank between the compacting step and the cooling step.

6. The process for producing a W—Ni sputtering target according to claim 5, which further comprises performing the thermomechanical or thermal treatment at temperatures in a range of from 970 to 1450° C.

7. The process for producing a W—Ni sputtering target according to claim 5, wherein the thermomechanical or thermal treatment includes at least one forging step.

\* \* \* \* \*

UNITED STATES PATENT AND TRADEMARK OFFICE
CERTIFICATE OF CORRECTION

| | |
|---|---|
| PATENT NO. | : 11,746,409 B2 |
| APPLICATION NO. | : 17/235003 |
| DATED | : April 20, 2021 |
| INVENTOR(S) | : Christian Linke et al. |

It is certified that error appears in the above-identified patent and that said Letters Patent is hereby corrected as shown below:

In the Specification

Column 6, Lines 33-37 should read as follows:
In the preferred case of a tubular sputtering target, in particular a one-piece tubular target, the radial direction is the main deformation direction. In the case of a plate-shaped target, the normal to the plane is the main deformation direction.

Signed and Sealed this
Fifth Day of December, 2023

Katherine Kelly Vidal
*Director of the United States Patent and Trademark Office*